(12) United States Patent
Lakhera et al.

(10) Patent No.: US 9,978,614 B2
(45) Date of Patent: May 22, 2018

(54) STRUCTURE AND METHOD TO MINIMIZE WARPAGE OF PACKAGED SEMICONDUCTOR DEVICES

(71) Applicant: FREESCALE SEMICONDUCTOR, INC., Austin, TX (US)

(72) Inventors: Nishant Lakhera, Austin, TX (US); James R. Guajardo, Georgetown, TX (US); Varughese Mathew, Austin, TX (US); Akhilesh K. Singh, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/191,870

(22) Filed: Jun. 24, 2016

(65) Prior Publication Data

US 2016/0307780 A1 Oct. 20, 2016

Related U.S. Application Data

(62) Division of application No. 14/472,882, filed on Aug. 29, 2014, now abandoned.

(51) Int. Cl.
*H01L 23/31* (2006.01)
*H01L 21/56* (2006.01)
(Continued)

(52) U.S. Cl.
CPC ............ *H01L 21/565* (2013.01); *H01L 21/78* (2013.01); *H01L 23/3135* (2013.01); *H01L 23/562* (2013.01); *H01L 24/97* (2013.01); *H01L 25/50* (2013.01); *H01L 24/29* (2013.01); *H01L 24/32* (2013.01); *H01L 24/48* (2013.01);
(Continued)

(58) Field of Classification Search
CPC ......................... H01L 23/3135; H01L 23/3192
See application file for complete search history.

(56) References Cited

U.S. PATENT DOCUMENTS 5,355,016 A * 10/1994 Swirbel ................ G11C 16/18
 174/389
5,976,912 A * 11/1999 Fukutomi ........... H01L 21/4803
 257/E21.502
(Continued)

FOREIGN PATENT DOCUMENTS

JP  WO 2014041684 A1 * 3/2014 ........... H01L 25/065
KR      20100053765 A  * 5/2010 ......... H01L 23/3135

OTHER PUBLICATIONS

Hirvikorpi et al, "Thin Inorganic Barrier Coatings for Packaging Materials", 2010 Place Conference, Apr. 18-21, 2010, Albuquerque, New Mexico, pp. 1-41.
(Continued)

*Primary Examiner* — Joshua King

(57) ABSTRACT

A packaged semiconductor device includes a substrate, an electronic device coupled to the substrate, encapsulant including a first major surface surrounding the electronic device, and an oxygen barrier layer within fifty percent of a thickness of the encapsulant from a second major surface of the encapsulant. The oxygen barrier covers at least a portion of an area of the second major surface of the encapsulant to help reduce or eliminate warping of the encapsulant and/or the substrate of the packaged semiconductor device due to oxidation. A thickness of the oxygen barrier layer is less than 100 microns.

14 Claims, 5 Drawing Sheets

(51) Int. Cl.
  *H01L 21/78* (2006.01)
  *H01L 25/00* (2006.01)
  *H01L 23/00* (2006.01)

(52) U.S. Cl.
  CPC ........ *H01L 24/73* (2013.01); *H01L 2224/291* (2013.01); *H01L 2224/2919* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/48465* (2013.01); *H01L 2224/73265* (2013.01); *H01L 2224/97* (2013.01); *H01L 2924/00014* (2013.01); *H01L 2924/14* (2013.01); *H01L 2924/15311* (2013.01); *H01L 2924/15312* (2013.01); *H01L 2924/15313* (2013.01); *H01L 2924/181* (2013.01); *H01L 2924/3511* (2013.01)

(56) References Cited

U.S. PATENT DOCUMENTS

| | | | | |
|---|---|---|---|---|
| 6,150,187 | A * | 11/2000 | Zyung | H01L 51/5253 438/126 |
| 6,376,769 | B1 * | 4/2002 | Chung | B32B 3/08 174/260 |
| 6,573,652 | B1 * | 6/2003 | Graff | H01L 23/562 257/E23.194 |
| 6,583,444 | B2 * | 6/2003 | Fjelstad | H01L 21/4832 257/100 |
| 6,923,702 | B2 | 8/2005 | Graff et al. | |
| 6,933,175 | B2 * | 8/2005 | Lo | H01L 21/561 257/E21.504 |
| 7,042,072 | B1 | 5/2006 | Kim et al. | |
| 7,387,945 | B2 | 6/2008 | Hara | |
| 7,776,434 | B2 | 8/2010 | Whiteker et al. | |
| 7,927,920 | B2 * | 4/2011 | Sasaki | H01L 23/49548 257/E21.001 |
| 8,673,690 | B2 * | 3/2014 | Iijima | H01L 21/77 257/737 |
| 2002/0163062 | A1 * | 11/2002 | Wang | H01L 21/02134 257/641 |
| 2003/0183915 | A1 * | 10/2003 | Scheifers | H01L 51/107 257/682 |
| 2006/0022338 | A1 * | 2/2006 | Meyer | H01L 23/3107 257/737 |
| 2008/0197455 | A1 * | 8/2008 | Fukuda | H01L 21/561 257/620 |
| 2008/0237866 | A1 * | 10/2008 | Wang | H01L 23/3192 257/753 |
| 2008/0305360 | A1 * | 12/2008 | Han | H01L 51/5256 428/690 |
| 2009/0258237 | A1 * | 10/2009 | Choi | H01L 23/291 428/447 |
| 2009/0278277 | A1 * | 11/2009 | Gong | B32B 33/00 264/171.1 |
| 2011/0006408 | A1 * | 1/2011 | Liao | H01L 21/561 257/660 |
| 2011/0049730 | A1 * | 3/2011 | Schmid | C23C 16/0272 257/787 |
| 2011/0104853 | A1 * | 5/2011 | Lo | H01L 21/568 438/113 |
| 2011/0105637 | A1 * | 5/2011 | Fujita | C08L 23/22 522/120 |
| 2011/0114992 | A1 | 5/2011 | Schmid et al. | |
| 2011/0121354 | A1 | 5/2011 | Schmid et al. | |
| 2011/0278703 | A1 * | 11/2011 | Pagaila | H01L 23/5389 257/659 |
| 2011/0298101 | A1 * | 12/2011 | Pagaila | H01L 24/95 257/659 |
| 2012/0025362 | A1 | 2/2012 | Chandrasekaran et al. | |
| 2012/0104591 | A1 * | 5/2012 | Warren | H01L 23/4334 257/712 |
| 2012/0161339 | A1 * | 6/2012 | Sekiguchi | H01L 21/561 257/791 |
| 2013/0200534 | A1 * | 8/2013 | Shiobara | H01L 21/78 257/787 |
| 2013/0295725 | A1 * | 11/2013 | Park | H01L 24/19 438/124 |
| 2014/0001652 | A1 | 2/2014 | Chen et al. | |
| 2014/0091455 | A1 * | 4/2014 | Strothmann | H01L 23/3114 257/734 |
| 2014/0091482 | A1 * | 4/2014 | Lin | H01L 24/11 257/782 |
| 2014/0138856 | A1 * | 5/2014 | Sekiguchi | H01L 23/295 257/790 |
| 2015/0060872 | A1 * | 3/2015 | Hosseini | H01L 23/34 257/76 |
| 2015/0364394 | A1 * | 12/2015 | Lin | H01L 24/03 257/734 |
| 2016/0027740 | A1 * | 1/2016 | Chiu | H01L 23/552 257/659 |

OTHER PUBLICATIONS

U.S. Appl. No. 14/472,882, Office Action—Restriction, dated May 8, 2015, 7 pages.
U.S. Appl. No. 14/472,882, Office Action—Non-Final, dated Sep. 16, 2015, 17 pages.
U.S. Appl. No. 14/472,882, Office Action—Final Rejection, dated Mar. 31, 2016, 27 pages.

* cited by examiner

STRUCTURE AND METHOD TO MINIMIZE WARPAGE OF PACKAGED SEMICONDUCTOR DEVICES

CROSS-REFERENCE TO RELATED APPLICATIONS

This application is a divisional of U.S. patent application Ser. No. 14/472,882 having a filing date of Aug. 29, 2014, common inventors, common assignee, which is incorporated by reference in its entirety.

BACKGROUND

Field

This disclosure relates generally to semiconductor devices, and more specifically, to minimizing warpage of packaged semiconductor devices.

Related Art

Warpage or deformation of a packaged semiconductor device is a common problem experienced in testing and real world environments. In some cases, warpage greatly affects the reliability and functionality of packaged semiconductor devices.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Materials used in packaged semiconductor devices oxidize when exposed to oxygen in the ambient environment. Oxidation is dependent upon various factors such as temperature, time, and material thickness. Oxidation of a semiconductor material often densifies the material, which may result in shrinkage of the material. Such shrinkage induces residual stresses in a packaged semiconductor device and causes warpage or deformation of the packaged semiconductor device. For example, when an encapsulant over a packaged semiconductor device oxidizes, the encapsulant densifies and shrinks, which results in the encapsulant "pulling" up on the sides of the packaged semiconductor device, which causes the packaged semiconductor device to warp. Warpage influences coplanarity of the packaged semiconductor device, where solder connections of a warped packaged semiconductor device are no longer coplanar within a same contact plane (e.g., the solder connections fail to make electrical contact with external pads). Warpage also affects board level device testing and reliability, where a packaged semiconductor device will experience extreme warpage after exposure to testing conditions that accelerate oxidation (e.g., 175° C. at 504 hours, or 150° C. at 1008 hours). The effects of oxidation will be increasingly damaging as packaged semiconductor devices become smaller and thinner.

The present disclosure provides for structures and methods to minimize warpage of a packaged semiconductor device by the presence of an oxygen barrier layer on one or more surfaces of a packaged semiconductor device. The oxygen barrier layer reduces or eliminates oxygen exposure to materials used in a packaged semiconductor device, which reduces or eliminates the oxidation resulting from such oxygen exposure in an ambient environment, which in turn reduces or eliminates the warpage of the packaged semiconductor device resulting from such oxidation.

Example Embodiments

Figure 1:
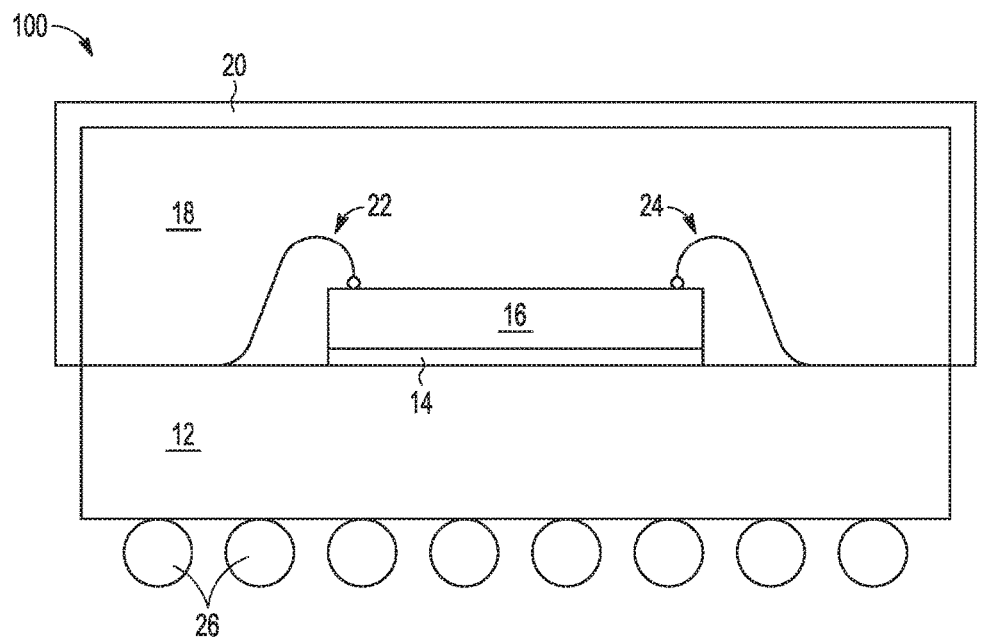
FIG. 1-4 illustrates block diagrams depicting cross-sectional views of example packaged semiconductor devices in which the disclosure is implemented, according to some embodiments.

FIG. 1 illustrates a block diagram depicting a cross-sectional view of an example packaged semiconductor device 100 in which the present disclosure is implemented. Packaged semiconductor device 100 includes a package substrate 12 having a top surface, a die 16 attached to the top surface of package substrate 12 with die attach material 14, and wire bonds 22 and 24 providing electrical connections between die 16 and package substrate 12. Packaged semiconductor device 100 also includes an encapsulant 18 formed over the top surface of package substrate 12, where encapsulant 18 surrounds and covers die 16 and wire bonds 22 and 24. Encapsulant 18 may include one or more layers of encapsulant materials. Packaged semiconductor device 100 also includes an oxygen barrier layer 20 formed over a top surface of encapsulant 18, as well as over side surfaces of encapsulant 18, where the side surfaces may or may not be perpendicular to the top surface of encapsulant 18. In some embodiments, packaged semiconductor device 100 also includes a plurality of solder connections 26 that are attached to the bottom surface of package substrate 12 and provide external connections, where the bottom surface of package substrate 12 is opposite the top surface of package substrate 12. In other embodiments, packaged semiconductor device 100 does not include solder connections 26.

Examples of die attach material 14 include polymer adhesives, epoxies, solders, films, and the like. Examples of package substrate 12 include, but are not limited to, a ball grid array (BGA) package substrate, redistributed chip package (RCP) substrate, flip chip package substrate, wire bond BGA package substrate, enhanced wafer level BGA package substrate, fan out wafer level package substrate, a land grid array (LGA) package substrate, a pin grid array (PGA) package substrate, flat package substrate, small outline package substrate, chip-scale package substrate, a die pad of a lead frame, lead fingers of a lead frame, and other form factors including a die mounting structure, a surface mount, a through-hole, a chip carrier, and the like. Examples of die 16 include, but are not limited to, an integrated circuit (IC) die, a semiconductor die including a semiconductor substrate, a sensor die, a passive component such as a resistor, a capacitor, an inductor, a battery, an oscillator, and the like, a sensor device, and the like. Examples of encapsulant 18 include, but are not limited to, mold compound, epoxy, underfill, glob top, dam and fill, and the like.

Oxygen barrier layer 20 includes one or more layers of an oxygen barrier material that reduces or eliminates oxygen exposure to encapsulant 18 from the ambient environment by preventing diffusion of oxygen through the one or more layers. The oxygen barrier material is also thermally stable and has good adhesion to materials used in packaged semiconductor devices. In some embodiments, the amount of oxidation affecting the packaged semiconductor device is proportional to the surface area of encapsulant 18 that is exposed to the ambient environment. The presence of oxygen barrier material reduces or eliminates oxygen exposure to encapsulant 18, which reduces or eliminates the oxidation resulting from such oxygen exposure from the ambient environment, which in turn reduces or eliminates the warpage of the packaged semiconductor device resulting from such oxidation. The presence of oxygen barrier layer 20 may be beneficial in packaged semiconductor devices having an encapsulant thickness of 500 microns or less over the die, and may be especially beneficial in ultra thin packaged semiconductor devices having a total thickness of 500 microns or less.

In some embodiments, oxygen barrier layer 20 has a thickness that is less than 100 micrometers (microns). In some embodiments, oxygen barrier layer 20 has a thickness that is also greater than 1 nanometer. In some embodiments, oxygen barrier layer 20 has a thickness that is also greater than 10 nanometers. In some embodiments, oxygen barrier layer 20 has a thickness in the range of 1 to 5 microns. Oxygen barrier layer 20 may be formed from one or more organic (e.g., polymers, synthetic rubbers) or inorganic (e.g., ceramic oxides) oxygen barrier materials. Examples of oxygen barrier materials include, but are not limited to, ceramic coating, ceramic oxide coating, zirconium oxide coating, alumina coating, synthetic rubber based coating, butyl rubber with filler, nitrile rubber with filler, polyurethane based coating, silicone based coating, silsesquioxane based coatings, and polymeric material with or without filler, and the like.

Figure 8:
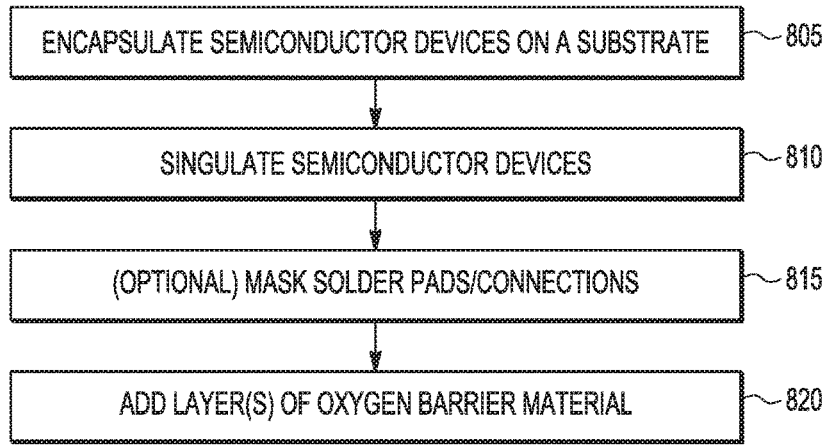
FIG. 8-10 illustrates block diagrams depicting example method steps in which the disclosure is implemented, according to some embodiments.

In some embodiments, oxygen barrier layer 20 is formed over encapsulant 18 after packaged semiconductor device 100 has been singulated from a group of packaged semiconductor devices formed from a single package substrate (e.g., a "chocolate bar" structure), which is shown in FIG. 8 as example steps 805, 810, and 820. In the embodiment shown in FIG. 1, oxygen barrier layer 20 covers top and side surfaces of encapsulant 18 to provide increased protection against oxygen exposure to encapsulant 18 from the ambient environment (e.g., coating top and side surfaces of encapsulant 18 with oxygen barrier layer 20 minimizes exposed surface area of encapsulant 18).

Oxygen barrier layer 20 is formed by some method of applying oxygen barrier material to encapsulant 18. In some embodiments, oxygen barrier layer 20 is formed by some method of spraying packaged semiconductor device 100 with oxygen barrier layer 20 to coat encapsulant 18. In other embodiments, oxygen barrier layer 20 is formed by some method of dipping packaged semiconductor device 100 into oxygen barrier material in order to coat encapsulant 18 with oxygen barrier layer 20. In still other embodiments, oxygen barrier layer 20 is applied to encapsulant 18 by at least one method of a group including, but not limited to, atomic layer deposition, physical vapor deposition, chemical vapor deposition, electrochemical deposition, sol-gel deposition, self-aligned monolayer coating, melting and enameling process, spin coating, spray coat, rolling on, brushing on, sponging on, dip coating, and the like.

In some embodiments, oxygen barrier layer 20 also covers at least a portion of at least one side surface of package substrate 12 (e.g., oxygen barrier layer 20 extends down the side surfaces of encapsulant 18 and also covers at least a portion of the side surfaces of package substrate 12). In some embodiments, oxygen barrier layer 20 is formed over encapsulant 18 before solder connections 26 are attached to package substrate 12, where solder pads for solder connections 26 are masked to prevent oxygen barrier layer 20 from being formed over the solder pads, shown in FIG. 8 as optional step 815. In other embodiments, oxygen barrier layer 20 is formed over encapsulant 18 after solder connections 26 are attached to package substrate 12, where package substrate 12 and solder connections 26 are masked to prevent oxygen barrier layer 20 from being formed over the bottom surface of package substrate 12 and over solder connections 26, shown in FIG. 8 as optional step 815.

Figure 2:
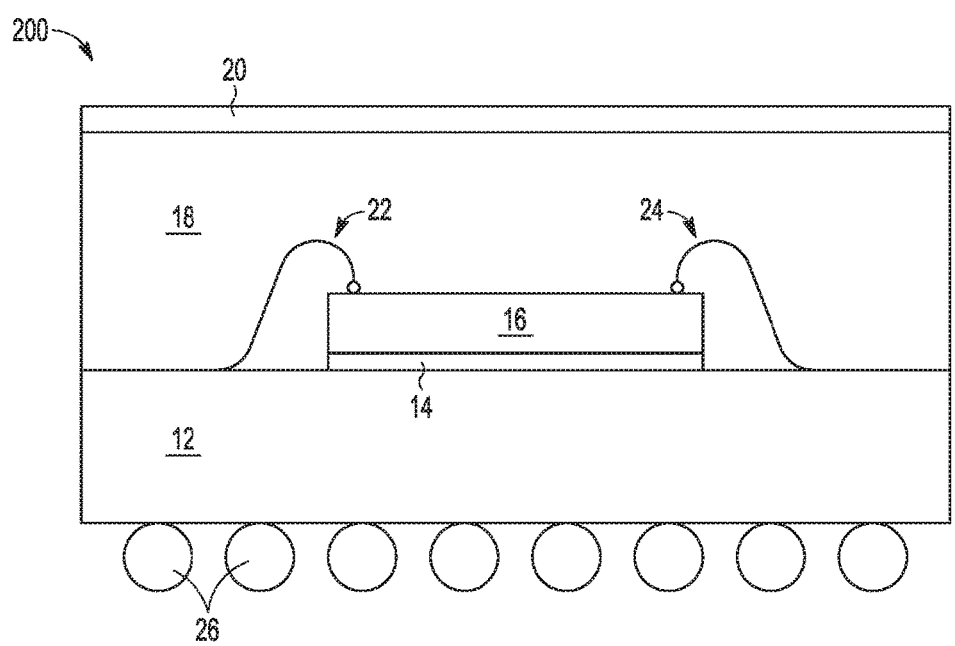
Figure 9:
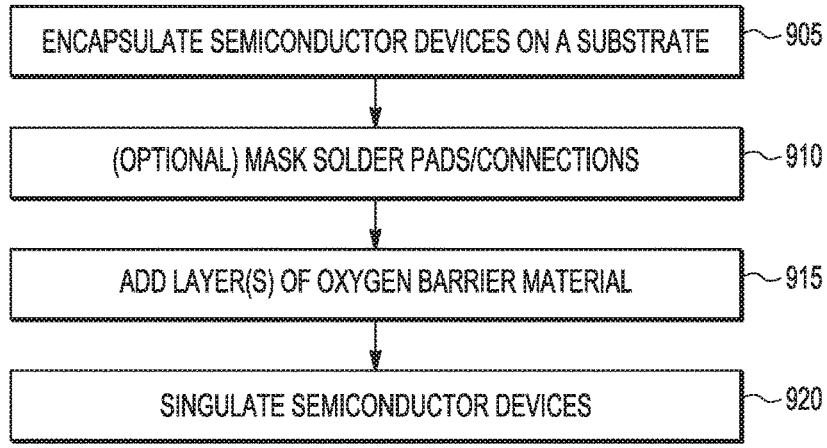

FIG. 2 illustrates a block diagram depicting a cross-sectional view of another example packaged semiconductor device 200 in which the present disclosure is implemented. Packaged semiconductor device 200 includes oxygen barrier layer 20 formed over a top surface of encapsulant 18. In some embodiments, oxygen barrier layer 20 is formed on the top surface of encapsulant 18 before packaged semiconductor device 200 is singulated from a group of packaged semiconductor devices formed on a single package substrate (e.g., a "chocolate bar" structure), which is shown in FIG. 9 as example steps 905, 915, and 920. Once singulated, oxygen barrier layer 20 remains on the top surface of encapsulant 18 of packaged semiconductor device 200, while the side surfaces of encapsulant 18 are exposed to the ambient environment.

As discussed above, the amount of oxidation affecting the packaged semiconductor device is proportional to the exposed surface area of encapsulant 18. The presence of oxygen barrier layer 20 over the top surface of encapsulant 18 reduces or eliminates oxygen exposure to encapsulant 18, which reduces or eliminates the oxidation resulting from such oxygen exposure, which in turn reduces or eliminates the warpage of the packaged semiconductor device resulting from such oxidation. The surface area of the top surface of encapsulant 18 is much greater (e.g., eight times greater) than the surface area of the exposed side surfaces of encapsulant 18, indicating that reduction of oxidation over the top surface of encapsulant 18 reduces or eliminates warpage of the packaged semiconductor device, despite encapsulant 18 having exposed side surfaces. Further, forming oxygen barrier layer 20 before singulation provides some benefit, such as simplifying the fabrication process and reducing fabrication costs and resources needed to produce the packaged semiconductor device. Aspects of oxygen barrier layer 20 are discussed above in connection with FIG. 1.

Figure 3:
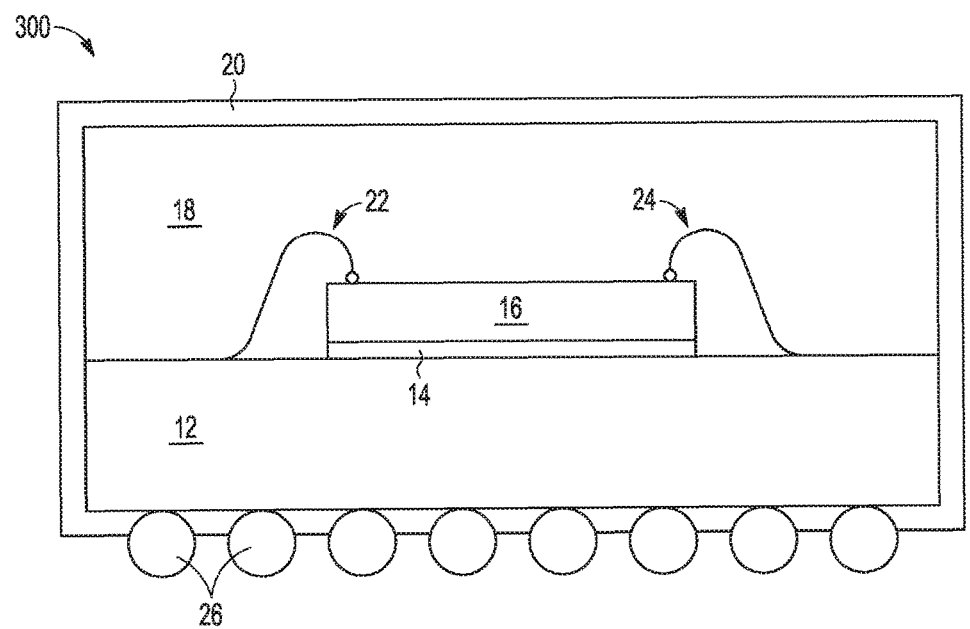

FIG. 3 illustrates a block diagram depicting a cross-sectional view of another example packaged semiconductor device 300 in which the present disclosure is implemented. Packaged semiconductor device 300 includes oxygen barrier layer 20 formed over a top surface of encapsulant 18, over side surfaces of encapsulant 18, over side surfaces of package substrate 12, and over a bottom surface of package substrate 12. In some embodiments, the amount of oxidation affecting the packaged semiconductor device is proportional to the surface area of encapsulant 18 and package substrate 12 that is exposed to the ambient environment.

In some embodiments, oxygen barrier layer 20 is formed after packaged semiconductor device 300 has been singulated from a group of packaged semiconductor devices formed from a single package substrate (e.g., a "chocolate bar" structure), which is shown in FIG. 8 as example steps 805, 810, and 820. In the embodiment shown in FIG. 3, oxygen barrier layer 20 is formed over top and side surfaces of encapsulant 18 and over bottom and side surfaces of package substrate 12 to provide increased protection against oxygen exposure to encapsulant 18 and package substrate 12 from the ambient environment (e.g., coating top and side surfaces of encapsulant 18 and bottom and side surfaces of package substrate 12 with oxygen barrier layer 20 minimizes exposed surface area of encapsulant 18 and package substrate 12).

In some embodiments, oxygen barrier layer 20 is formed over top and side surfaces of encapsulant 18 and bottom and side surfaces of package substrate 12 before solder connections 26 are attached to package substrate 12, where solder pads for solder connections 26 are masked to prevent oxygen barrier layer 20 from being formed over the solder pads, show in FIG. 8 as optional step 815. In other embodiments, oxygen barrier layer 20 is formed over top and side surfaces of encapsulant 18 and bottom and side surfaces of package substrate 12 after solder connections 26 are attached to package substrate 12, where solder connections 26 are masked to prevent oxygen barrier layer 20 from being formed over solder connections 26, shown in FIG. 8 as optional step 815. Aspects of oxygen barrier layer 20 are discussed above in connection with FIG. 1.

Figure 4:
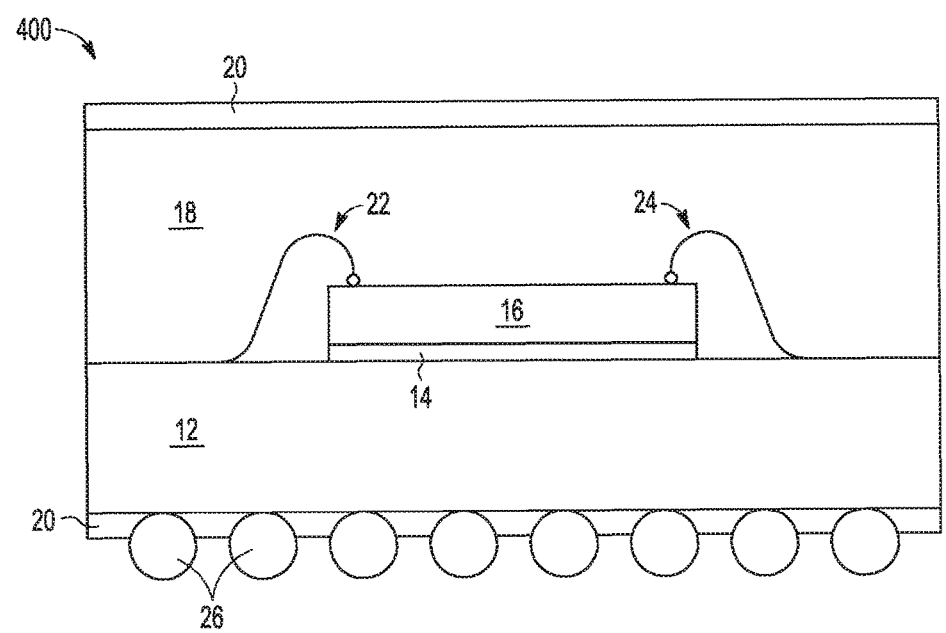

FIG. 4 illustrates a block diagram depicting a cross-sectional view of another example packaged semiconductor device 400 in which the present disclosure is implemented. Packaged semiconductor device 400 includes oxygen barrier layer 20 formed over a top surface of encapsulant 18 and a bottom surface of package substrate 12. In some embodiments, oxygen barrier layer 20 is formed on the top surface of encapsulant 18 and on the bottom surface of package substrate 12 before packaged semiconductor device 400 is singulated from a group of packaged semiconductor devices formed on a single package substrate (e.g., a "chocolate bar" structure), which is shown in FIG. 9 as example steps 905, 915, and 920. Once singulated, oxygen barrier layer 20 remains on the top surface of encapsulant 18 and on the bottom surface of package substrate 12 of packaged semiconductor device 400, while the side surfaces of encapsulant 18 and package substrate 12 are exposed to the ambient environment. As discussed above, the presence of oxygen barrier layer 20 over the top surface of encapsulant 18 and the bottom surface of package substrate 12 reduces or eliminates oxygen exposure to encapsulant 18 and package substrate 12, despite encapsulant 18 and package substrate 12 having exposed side surfaces. The oxidation resulting from such oxygen exposure is reduced or eliminated, which in turn reduces or eliminates the warpage of the packaged semiconductor device resulting from such oxidation.

In some embodiments, oxygen barrier layer 20 is formed over a top surface of encapsulant 18 and a bottom surface package substrate 12 before solder connections 26 are attached to package substrate 12, where solder pads for solder connections 26 are masked to prevent oxygen barrier layer 20 from being formed over the solder pads, shown in FIG. 9 as optional step 910. In other embodiments, oxygen barrier layer 20 is formed over a top surface of encapsulant 18 and a bottom surface of package substrate 12 after solder connections 26 are attached to package substrate 12, where solder connections 26 are masked to prevent oxygen barrier layer 20 from being formed over solder connections 26, shown in FIG. 9 as optional step 910. Aspects of oxygen barrier layer 20 are discussed above in connection with FIG. 1.

Figure 5:
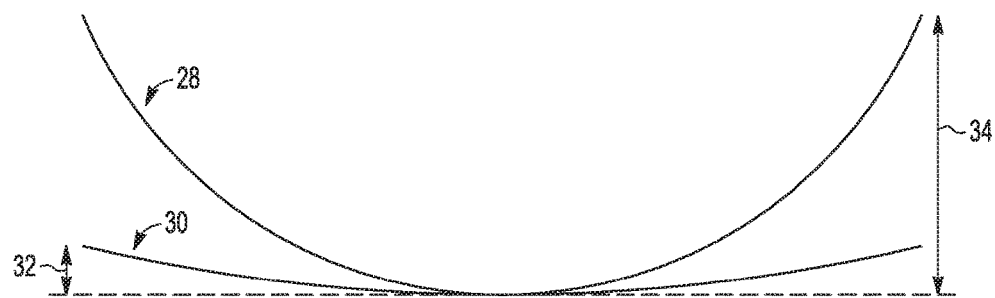
FIG. 5 illustrates side views contrasting warpage of example packaged semiconductor devices, according to some embodiments.

FIG. 5 illustrates side views contrasting warpage of example packaged semiconductor devices. Surface curve 28 represents a maximum curvature of a bottom surface of a first packaged semiconductor device that has an encapsulant but does not have an oxygen barrier layer. Surface curve 30 represents a maximum curvature of a bottom surface of a second packaged semiconductor device that has both encapsulant and oxygen barrier layer (such as those packaged semiconductor devices illustrated in FIGS. 1-4 and 6-7). Warpage of the first and second packaged semiconductor devices is illustrated as the curvature of the surface curves 28 and 30, respectively. A first amount of warpage 34 of the first packaged semiconductor device is measured as the difference between a center point of surface curve 28 to an edge point of surface curve 28. A second amount of warpage 32 of the second packaged semiconductor device is measured as the difference between a center point of surface curve 30 to an edge point of surface curve 30.

As illustrated, warpage amount 32 is much smaller than warpage amount 34 (e.g., eight times smaller), indicating that the second packaged semiconductor device (with the oxygen barrier layer) has less warpage than the first packaged semiconductor device (without the oxygen barrier layer). An example warpage amount 34 includes, but is not limited to, 100 to 300 microns, such as 160 microns. An example warpage amount 32 includes, but is not limited to, 20 to 100 microns, such as 80 microns. In some embodiments, an example warpage amount 32 is also less than 65 microns. Warpage amount 32 and 34 may be lesser or greater depending upon the thickness and stiffness of the package substrate, the thickness of the encapsulant, and the ratio of the encapsulant thickness to oxygen barrier layer thickness (where warpage may become more severe in packaged semiconductor devices that have a thin encapsulant thickness, as compared to oxygen barrier layer thickness).

Figure 6:
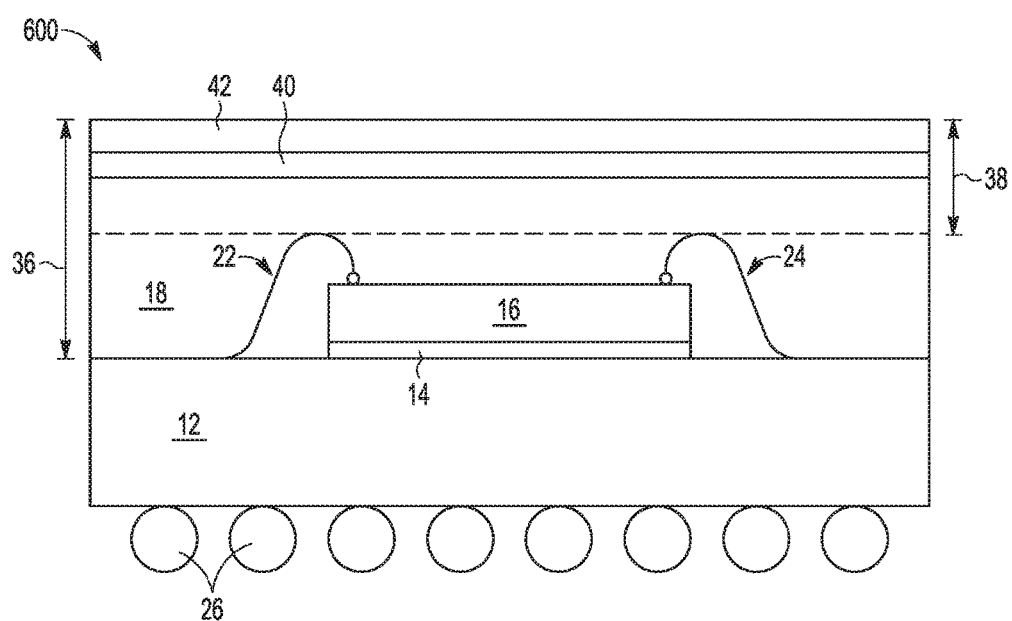
FIG. 6-7 illustrates block diagrams depicting cross-sectional views of other example packaged semiconductor devices in which the disclosure is implemented, according to some embodiments.

FIG. 6 illustrates a block diagram depicting a cross-sectional view of an example packaged semiconductor device 600 in which the present disclosure is implemented. Packaged semiconductor device 600 includes encapsulant 18, oxygen barrier layer 40, and an encapsulant layer 42 reaching a total thickness 36, which is measured from the top surface of the package substrate 12 to a top surface of encapsulant layer 42. In some embodiments, encapsulant layer 42 includes the same encapsulant material(s) as encapsulant 18. In other embodiments, encapsulant layer 42 is a different encapsulant material than encapsulant 18. In the embodiment shown, a partial thickness 38 is illustrated as some percentage of total thickness 36, which is measured from the top surface of layer 42 to the dotted line positioned at the percentage of thickness 36. In some embodiments, partial thickness 38 is 50% of total thickness 36. In other embodiments, partial thickness 38 is less than 50% of total thickness 36, such as 33% or 25% of total thickness 36. Oxygen barrier layer 40 is formed within some portion of partial thickness 38. In some embodiments, encapsulant 18 is formed over package substrate 12, oxygen barrier layer 40 is formed over encapsulant 18, and encapsulant layer 42 is formed over oxygen barrier layer 40.

Figure 10:
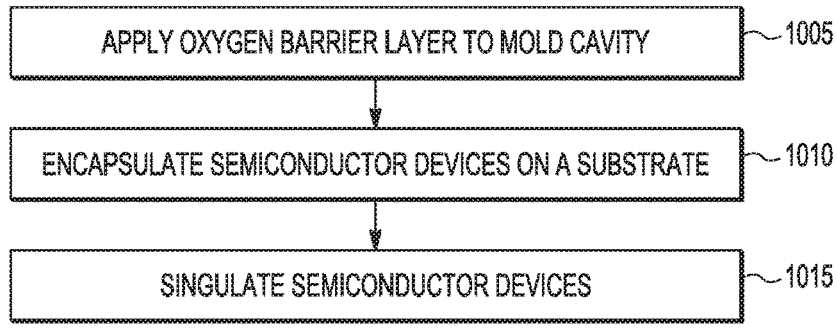

In some embodiments, oxygen barrier layer 40 is non-uniformly diffused through a portion of encapsulant 18 within partial thickness 38, while in other embodiments, oxygen barrier layer 40 is uniformly diffused through a portion of encapsulant 18 within partial thickness 38. In some embodiments, a non-uniform encapsulant layer 42 is present over at least a portion of oxygen barrier layer 40, while in other embodiments, a uniform encapsulant layer 48 is present over at least a portion of oxygen barrier layer 40. In some embodiments, oxygen barrier layer 40 is formed along a surface of a mold structure cavity, packaged semiconductor device 600 is positioned into the mold structure cavity, and encapsulant 18 is formed in the negative space between oxygen barrier layer 40 and package substrate 12, die 16, die attach material 14, and wire bonds 22 and 24, which is shown in FIG. 10 as example steps 1005, 1010, and 1015.

Figure 7:
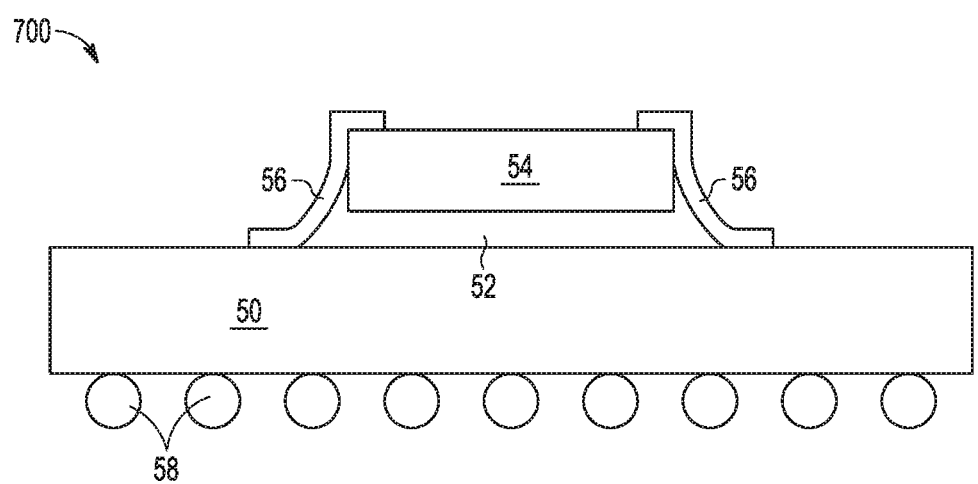

FIG. 7 illustrates a block diagram depicting a cross-sectional view of an example packaged semiconductor device 700 in which the present disclosure is implemented. Packaged semiconductor device 700 includes a package substrate 50 (such as package substrate 12, including a flip chip package substrate, as discussed above), a die 54 (such as die 16, as discussed above), and encapsulant 52 (such as encapsulant 18, as discussed above) that underfills the negative space between die 54 and a top surface of package substrate 50. In some embodiments, packaged semiconductor device 700 also includes a plurality of solder connections 58.

Packaged semiconductor device 700 also includes oxygen barrier layer 56 formed over encapsulant 52 to reduce or eliminate oxygen exposure to encapsulant 52. In some embodiments, oxygen barrier layer 56 also covers a portion of at least one side surface of die 54. In some embodiments, oxygen barrier layer 56 also covers at least a portion of a top surface of die 54, while in other embodiments, oxygen barrier layer 56 covers the entire top surface of die 54. In some embodiments, oxygen barrier layer 56 also covers at least a portion of a top exposed surface of package substrate 50, while in other embodiments oxygen barrier layer 56 covers the entire top exposed surface of package substrate 50. In some embodiments, oxygen barrier layer 56 also covers a portion of at least one side surface of package substrate 50, while in other embodiments, oxygen barrier layer 56 covers the entire side surface(s) of package substrate 50.

By now it should be appreciated that there has been provided embodiments of methods and packaged semiconductor devices for minimizing warpage of a packaged semiconductor device by the presence of an oxygen barrier layer on one or more surfaces of a packaged semiconductor device. The oxygen barrier layer reduces or eliminates oxygen exposure to materials used in a packaged semiconductor device, which reduces or eliminates the oxidation resulting from such oxygen exposure in an ambient environment, which in turn reduces or eliminates the warpage of the packaged semiconductor device resulting from such oxidation.

The present disclosure provides an embodiment of a packaged semiconductor device including a substrate; an electronic device coupled to the substrate; encapsulant including a first major surface surrounding the electronic device; and an oxygen barrier layer within fifty percent of a thickness of the encapsulant from a second major surface of the encapsulant. The oxygen barrier covers at least a portion of an area of the second major surface of the encapsulant, where a thickness of the oxygen barrier layer is less than 100 microns.

One aspect of the above embodiment further provides that the oxygen barrier is in direct contact with the second major surface of the encapsulant.

Another aspect of the above embodiment further provides that the thickness of the oxygen barrier layer is greater than 1 nanometer.

Another aspect of the above embodiment further provides that the packaged semiconductor device further includes the oxygen barrier layer covers at least one sidewall of the encapsulant.

Another aspect of the above embodiment further provides that the packaged semiconductor device further includes the oxygen barrier layer covers at least a portion of a major surface of the substrate.

Another aspect of the above embodiment further provides that the oxygen barrier layer is made of one of a group consisting of: ceramic coating, ceramic oxide coating, zirconium oxide coating, alumina coating, synthetic rubber based coating, butyl rubber with filler, nitrile rubber with filler, polyurethane based coating, silicone based coating, silsesquioxane based coatings, and polymeric material with or without filler.

Another aspect of the above embodiment further provides that the oxygen barrier layer is applied by one of a group consisting of: atomic layer deposition, physical vapor deposition, chemical vapor deposition, electrochemical deposition, sol-gel deposition, self-aligned monolayer coating, melting and enameling process, spin coating, spray coat, rolling on, brushing on, sponging on, dip coating.

Another aspect of the above embodiment further provides that the oxygen barrier layer includes a first layer of a first material and a second layer of a second material.

The present disclosure provides an embodiment of a method, which includes encapsulating a semiconductor device on a substrate in an encapsulant; and adding a layer of oxygen barrier material to the encapsulant, where a thickness of the oxygen barrier material is less than 100 microns. The adding the oxygen barrier material is performed by one of a group consisting of: embedding the oxygen barrier material within fifty percent of a thickness of the encapsulant from a first major surface of the encapsulant, applying the oxygen barrier material over the first major surface of the encapsulant, and applying the oxygen barrier material to a surface of a mold cavity before the encapsulant is injected into the mold cavity.

One aspect of the above embodiment further provides that the method further includes applying the oxygen barrier material to at least one sidewall of the encapsulant.

Another aspect of the above embodiment further provides that the method further includes applying the oxygen barrier to at least a portion of a surface of the substrate.

Another aspect of the above embodiment further provides that the applying the oxygen barrier material is performed at one of a time consisting of: after the encapsulating and before the encapsulating.

Another aspect of the above embodiment further provides that the oxygen barrier material extends over at least a portion of an area of the first major surface of the encapsulant.

The present disclosure provides another embodiment of a packaged semiconductor device that includes a substrate; an electronic device coupled to the substrate; encapsulant including a first major surface surrounding the electronic device; and oxygen barrier material covering at least a portion of a second major surface of the encapsulant, where a thickness of the oxygen barrier material is less than 100 microns.

One aspect of the above embodiment further provides that the oxygen barrier material is in direct contact with the second major surface of the encapsulant.

Another aspect of the above embodiment further provides that the thickness of the oxygen barrier material is greater than 1 nanometer.

Another aspect of the above embodiment further provides that the oxygen barrier material covers at least one sidewall of the encapsulant.

Another aspect of the above embodiment further provides that the oxygen barrier material covers at least a portion of a major surface of the substrate.

Another aspect of the above embodiment further provides that the oxygen barrier material includes a first layer of a first material and a second layer of a second material.

Another aspect of the above embodiment further provides that a form factor of the packaged semiconductor device is one of a group consisting of: a through-hole, surface mount, chip carrier, pin grid array, flat package, small outline package, chip-scale package, redistributed chip package, wafer level fan-out, and ball grid array.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
    encapsulating a plurality of semiconductor devices on a top surface of a package substrate in an epoxy encapsulant,
        wherein each semiconductor device comprises a semiconductor die attached to the top surface of the package substrate and a plurality of wire bond connections between the semiconductor die and the top surface of the package substrate,
        wherein the epoxy encapsulant has a first major surface in contact with the top surface of the substrate and has a second major surface opposite the first major surface, and
        the epoxy encapsulant surrounds and covers each semiconductor die and the plurality of wire bond connections;
    adding a layer of oxygen barrier material to the epoxy encapsulant, wherein the oxygen barrier material comprises a first layer including synthetic rubber, wherein a thickness of the oxygen barrier material is less than 100 microns and the adding the oxygen barrier material is performed by
        applying the oxygen barrier material over the second major surface of the epoxy encapsulant; and
    subsequent to the adding the layer of oxygen barrier material, singulating the package substrate, including the epoxy encapsulant and the plurality of semiconductor devices, into a plurality of packaged semiconductor devices.

2. The method of claim 1, further comprising applying a layer of the oxygen barrier material to at least a portion of a bottom surface of the package substrate before the singulating.

3. The method of claim 1, further comprising:
    applying a layer of the oxygen barrier material to a bottom surface of the package substrate before solder connections are formed as external connections on the bottom surface of the package substrate.

4. The method of claim 1, further comprising masking solder connections on a bottom surface of the substrate before applying a layer of oxygen barrier material to at least a portion of the bottom surface of the package substrate.

5. The method of claim 1, wherein the oxygen barrier material is in direct contact with the second major surface of the epoxy encapsulant.

6. The method of claim 1, wherein the thickness of the oxygen barrier material is greater than 1 nanometer.

7. The method of claim 1, wherein the applying a layer of the oxygen barrier material further includes applying a second layer of a second material.

8. The method of claim 7, wherein the second material of the oxygen barrier material comprises one of a group consisting of: polyurethane based coating, silicone based coating, silsesquioxane based coatings, and polymeric material with or without filler.

9. The method of claim 7, wherein the second material of the oxygen barrier material comprises inorganic material.

10. The method of claim 9, wherein the inorganic material comprises one of a group consisting of: ceramic coating, ceramic oxide coating, zirconium oxide coating, and alumina coating.

11. The method of claim 1, wherein the synthetic rubber comprises one of a group consisting of: synthetic rubber based coating, butyl rubber with filler, and nitrile rubber with filler.

12. The method of claim 1, wherein the oxygen barrier material is applied by one of a group consisting of: atomic layer deposition, physical vapor deposition, chemical vapor deposition, electrochemical deposition, sol-gel deposition, self-aligned monolayer coating, melting and enameling process, spin coating, spray coat, rolling on, brushing on, sponging on, dip coating.

13. The method of claim 1, wherein a form factor of the plurality of packaged semiconductor devices is one of a group consisting of: a through-hole, surface mount, chip carrier, pin grid array, flat package, small outline package, chip-scale package, redistributed chip package, wafer level fan-out, and ball grid array.

14. The method of claim 1 wherein a resulting warpage of the packaged semiconductor devices is within a range of 20 to 100 microns.

* * * * *